United States Patent
Kuriyama

(10) Patent No.: US 10,280,503 B2
(45) Date of Patent: May 7, 2019

(54) MAGNETIC-FIELD-GENERATING APPARATUS FOR MAGNETRON SPUTTERING

(71) Applicant: HITACHI METALS, LTD., Tokyo (JP)

(72) Inventor: Yoshihiko Kuriyama, Takasaki (JP)

(73) Assignee: HITACHI METALS, LTD., Tokyo (JP)

(*) Notice: Subject to any disclaimer, the term of this patent is extended or adjusted under 35 U.S.C. 154(b) by 109 days.

(21) Appl. No.: 15/547,541

(22) PCT Filed: Mar. 11, 2016

(86) PCT No.: PCT/JP2016/057752
§ 371 (c)(1),
(2) Date: Jul. 31, 2017

(87) PCT Pub. No.: WO2016/148058
PCT Pub. Date: Sep. 22, 2016

(65) Prior Publication Data
US 2018/0023189 A1    Jan. 25, 2018

(30) Foreign Application Priority Data
Mar. 19, 2015 (JP) .................. 2015-056455

(51) Int. Cl.
*C23C 14/34* (2006.01)
*C23C 14/35* (2006.01)
*H01J 37/34* (2006.01)

(52) U.S. Cl.
CPC .......... *C23C 14/35* (2013.01); *C23C 14/3457* (2013.01); *H01J 37/3408* (2013.01); *H01J 37/3452* (2013.01)

(58) Field of Classification Search
CPC .. C23C 14/35; C23C 14/3457; H01J 37/3408; H01J 37/3452
See application file for complete search history.

(56) References Cited

U.S. PATENT DOCUMENTS 5,262,028 A * 11/1993 Manley ............... H01J 37/3452
204/192.12

FOREIGN PATENT DOCUMENTS

JP    03-257162 A    11/1991
JP    03257162 A * 11/1991
(Continued)

OTHER PUBLICATIONS

International Search Report of PCT/JP2016/057752 dated May 10, 2016 [PCT/ISA/210].

*Primary Examiner* — John J Brayton
(74) *Attorney, Agent, or Firm* — Sughrue Mion, PLLC

(57) ABSTRACT

A racetrack-shaped apparatus for generating a magnetic field on a target surface for magnetron sputtering, comprising on a magnetic base (a) a vertically magnetized center permanent magnet arranged straight; (b) vertically magnetized peripheral permanent magnets surrounding the center permanent magnet; (c) vertically magnetized first intermediate permanent magnets, horizontally magnetized second intermediate permanent magnets and vertically magnetized third intermediate permanent magnets arranged on both sides of the center permanent magnet; and (d) vertically magnetized fourth intermediate permanent magnets arranged separately from both longitudinal ends of the center permanent magnet; each second intermediate permanent magnet being arranged with one magnetic pole opposing a near-target side surface portion of each first intermediate permanent magnet.

4 Claims, 9 Drawing Sheets

(56) References Cited

FOREIGN PATENT DOCUMENTS

| JP | 04-063273 A | | 2/1992 |
|----|----|----|----|
| JP | 04063273 A | * | 2/1992 |
| JP | 2004-083974 A | | 3/2004 |
| JP | 2004083974 A | * | 3/2004 |
| JP | 2014-210967 A | | 11/2014 |
| JP | 2014210967 A | * | 11/2014 |
| JP | 2015-147955 A | | 8/2015 |
| JP | 2015147955 A | * | 8/2015 |

* cited by examiner

MAGNETIC-FIELD-GENERATING APPARATUS FOR MAGNETRON SPUTTERING

CROSS REFERENCE TO RELATED APPLICATIONS

This application is a National Stage of International Application No. PCT/JP2016/057752 filed Mar. 11, 2016 (claiming priority based on Japanese Patent Application No. 2015-056455 filed Mar. 19, 2015), the contents of which are incorporated herein by reference in their entirety.

FIELD OF THE INVENTION

The present invention relates to a magnetic-field-generating apparatus assembled in a magnetron sputtering apparatus used for forming a thin film on a substrate surface.

BACKGROUND OF THE INVENTION

Sputtering is a phenomenon that atoms or molecules are projected from a target, against which an inactive material such as Ar, etc. impinges at a high speed, and that the projected atoms or molecules are attached to a substrate to form a thin film. A magnetron sputtering method uses a magnetic field in a cathode to accelerate an accumulating speed of a target material on a substrate, forming a thin film at a low temperature because of no collision of electrons to the substrate. Accordingly, the magnetron sputtering method is widely used to form thin films on substrates in the production of electronic devices such as semiconductor ICs, flat panel displays and solar cells, reflection films, etc.

A magnetron sputtering apparatus comprises, in a vacuum chamber, a substrate (anode), a target (cathode) opposing the substrate, and a magnetic-field-generating apparatus arranged under the target. Voltage applied between the anode and the cathode causes glow discharge, ionizing an inert gas (for example, Ar gas at about 0.1 Pa) in the vacuum chamber, and secondary electrons discharged from the target are captured by a magnetic field generated by the magnetic-field-generating apparatus to cause a cycloidal motion on the target surface. The cycloidal motion of electrons accelerates the ionization of gas molecules, resulting in a drastically increased film-forming speed than without a magnetic field, with larger film adhesion strength.

A magnetic-field-generating apparatus in a magnetron sputtering apparatus, which can generate a circular or racetrack-shaped magnetic field, conventionally comprises, as shown in FIGS. 10(a) to 10(c), for example, a straight center magnetic pole member, a peripheral magnetic pole member surrounding the center magnetic pole member, and pluralities of permanent magnets arranged between the center magnetic pole member and the peripheral magnetic pole member for a horizontal magnetization direction with magnetic poles of the same polarity opposing the center magnetic pole member. When magnetron sputtering is conducted using a magnetic-field-generating apparatus having such a structure, the target undergoes V-cross-sectioned erosion as shown in FIG. 11, resulting in insufficient use efficiency of the target.

In conventional magnetron sputtering, to improve the use efficiency of a target, means for making an erosion region of a target more uniform, namely means for making the cross section shape of erosion from a V shape to a U shape have been contemplated. A more uniform erosion region of a target can be achieved by, for example, the mechanical swinging of a target or a magnetic circuit, the movement or rotation of part of magnets in the magnetic circuit, etc. However, the mechanical swinging of a target or a magnetic circuit for achieving uniform erosion of the target results in drastic cost increase such as a larger apparatus, so that it is practically difficult.

JP 2004-83974 A discloses in FIGS. 1 and 2 a magnetic-field-generating apparatus for forming a film by sputtering, which generates a magnetic field having magnetic force lines, in which positions at which a vertical component of a magnetic flux density is zero on a substrate-side target surface expand outward from a center portion of the target as vertically separating from the target, thereby suppressing the diffusion of plasma toward the substrate to provide uniform distributions of film thickness and quality. JP 2004-83974 A describes that by forming magnetic force lines near the target surface substantially in parallel with the target surface, an erosion region can be expanded wider in a range from a target center portion toward its peripheral portion, thereby improving the use efficiency of a target material.

However, the magnetic-field-generating apparatus of JP 2004-83974 A forms magnetic force lines providing a magnetic tunnel between center and peripheral portions of the target on the target surface, and a ratio B1/B2 being 2.5 or more, wherein B1 is an absolute value of a vertical component of a magnetic flux density at a position at which a horizontal component of a magnetic flux density is zero near the center portion of the target surface, and B2 is the maximum absolute value of a vertical component of a magnetic flux density near the peripheral portion of the target surface, namely, the vertical component B1 of a magnetic flux density in the center portion being as large as 2.5 times or more the vertical component B2 of a magnetic flux density in the peripheral portion, resulting in insufficient uniformity of an erosion region. Thus, further improvement is desired.

OBJECT OF THE INVENTION

Accordingly, an object of the present invention is to provide a magnetic-field-generating apparatus for magnetron sputtering, which provides a more uniform magnetic flux density distribution on the target to improve the use efficiency of a target.

SUMMARY OF THE INVENTION

As a result of intensive research in view of the above object, the inventor has found that a racetrack-shaped magnetic-field-generating apparatus for magnetron sputtering, which comprises a straight center permanent magnet magnetized vertically to a target surface, vertically magnetized peripheral permanent magnets surrounding the center permanent magnet, vertically magnetized first and third intermediate permanent magnets arranged in a straight portion of the racetrack shape in parallel with the center permanent magnet, second intermediate permanent magnets arranged between the first and third intermediate permanent magnets and magnetized horizontally to the target surface, and vertically magnetized fourth intermediate permanent magnets arranged in corner portions of the racetrack shape, has a wider U-shaped erosion region than in conventional magnetic-field-generating apparatuses, because of three portions in which a vertical component of a magnetic flux density is zero, resulting in extremely improved use efficiency of the target. The present invention has been completed based on such finding.

Thus, the magnetic-field-generating apparatus of the present invention for magnetron sputtering comprising a straight portion and corner portions, and opposing a target to generate a magnetic field on a target surface, comprises on a magnetic base (a) a center permanent magnet arranged straight in the straight portion with its magnetization direction perpendicular to the target surface;

(b) peripheral permanent magnets surrounding the center permanent magnet to form a racetrack-shaped periphery, with their magnetization directions perpendicular to the target surface, and their magnetic poles opposing the target being opposite to that of the center permanent magnet;

(c) first, second and third intermediate permanent magnets arranged straight in the straight portion on both sides of the center permanent magnet, in parallel with the center permanent magnet, in this order toward the peripheral permanent magnets; and (d) fourth intermediate permanent magnets arranged in the corner portions and longitudinally separate from both ends of the center permanent magnet, with their magnetization directions perpendicular to the target surface, and their magnetic poles opposing the target being opposite to that of the center permanent magnet;

the first intermediate permanent magnets being arranged with their magnetization directions perpendicular to the target surface, their magnetic poles opposing the target being opposite to that of the center permanent magnet;

the second intermediate permanent magnets being arranged on the base via a magnetic gap, with their magnetization directions in parallel with the target surface, such that one magnetic pole of each second intermediate permanent magnet opposes a near-target side surface portion of each first intermediate permanent magnet, and that a magnetic pole of each second intermediate permanent magnet opposing the near-target side surface is opposite to the magnetic pole of the center permanent magnet opposing the target; and the third intermediate permanent magnets being arranged with their magnetization directions perpendicular to the target surface, their magnetic poles opposing the target being the same as that of the center permanent magnet.

When the magnetic-field-generating apparatus of the present invention for magnetron sputtering is used, there are preferably three points having no vertical component of a magnetic flux density on a target surface, in a transverse direction from a position opposing a longitudinal center of the center permanent magnet.

It is preferable that the center permanent magnet, the first intermediate permanent magnets and the peripheral permanent magnets are constituted by neodymium magnets; that the second, third and fourth intermediate permanent magnets are constituted by ferrite magnets; and that the center permanent magnet has a smaller residual magnetic flux density than those of the first intermediate permanent magnets.

A magnetic flux density in parallel direction to the target surface is preferably 10 mT or more in portions where the magnetic flux density is zero in a perpendicular direction to the target surface.

EFFECTS OF THE INVENTION

The use of the magnetic-field-generating apparatus of the present invention provides a target surface with three portions in which a vertical component of a magnetic flux density is zero, expanding an erosion region in a U shape than in conventional magnetic-field-generating apparatuses, thereby making the erosion of the target more uniform, resulting in improved use efficiency of the target.

DESCRIPTION OF THE PREFERRED EMBODIMENTS

[1] Magnetic-Field-Generating Apparatus for Magnetron Sputtering (1) Structure

Figure 1A:
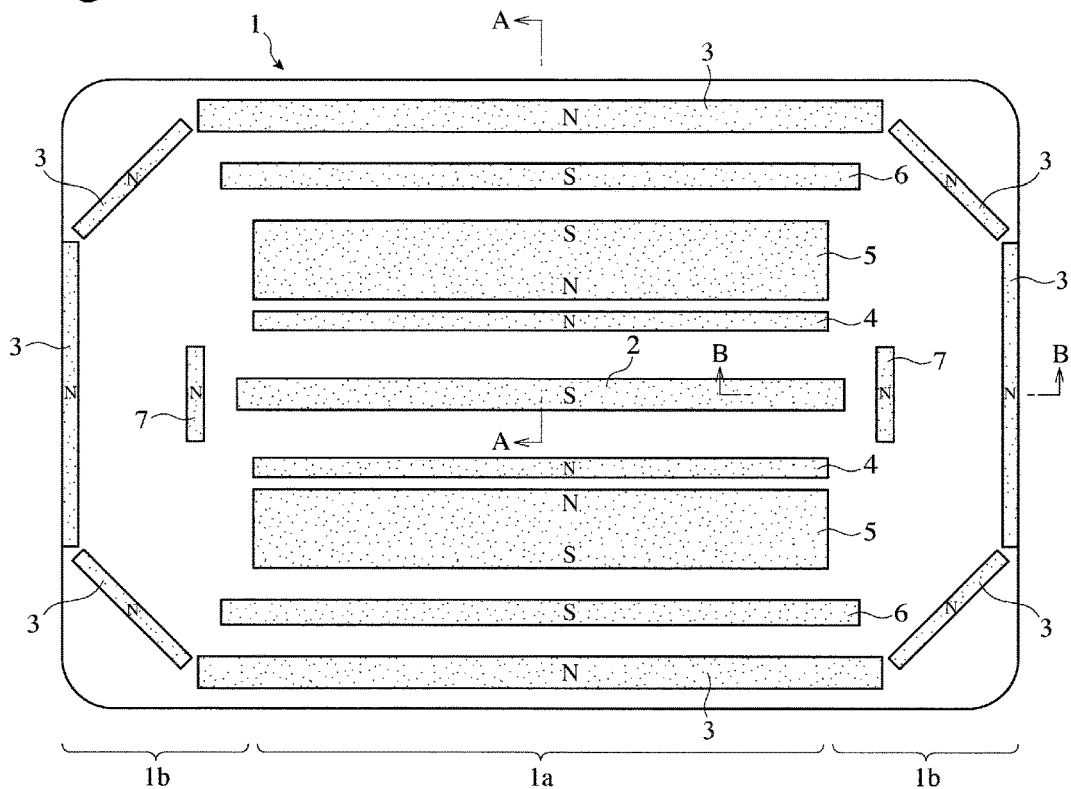
FIG. 1(a) is a plan view showing an example of magnetic-field-generating apparatuses for magnetron sputtering according to the present invention.
Figure 1B:
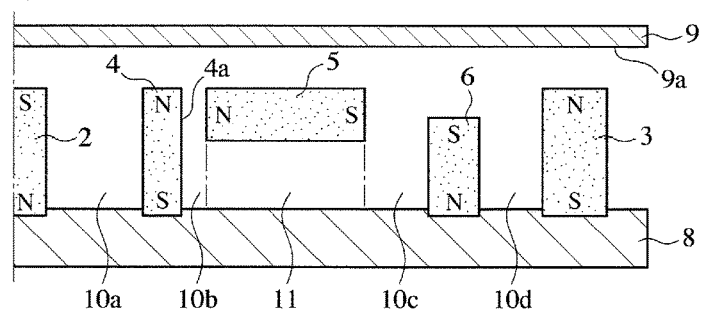
FIG. 1(b) is a cross-sectional view taken along the line A-A in FIG. 1(a).

The apparatus of the present invention for generating a racetrack-shaped magnetic field for magnetron sputtering on a target surface, which is arranged opposing a target 9, has, as shown in, for example, FIGS. 1(a) and 1(b), a racetrack shape comprising a straight portion 1a and two corner portions 1b, 1b.

The magnetic-field-generating apparatus 1 for magnetron sputtering comprises on a magnetic base 8

(a) a center straight permanent magnet 2 arranged in the straight portion 1a, with its magnetization direction perpendicular to the target surface 9a;

(b) peripheral permanent magnets 3 surrounding the center permanent magnet 2 to form a racetrack-shaped periphery, with their magnetization directions perpendicular to the target surface 9a, and their magnetic poles opposing the target 9 being opposite to that of the center permanent magnet 2;

(c) first, second and third intermediate permanent magnets 4, 5, 6 arranged straight on both sides of the center permanent magnet 2 in the straight portion 1a, in parallel with the center permanent magnet 2 in this order toward each peripheral permanent magnet 3; and (d) fourth intermediate permanent magnets 7 arranged in the corner portions 1b, 1b between the center permanent magnet 2 and the peripheral permanent magnets 3, such that they are longitudinally separate from both ends of the center permanent magnet 2, with their magnetization directions perpendicular to the target surface 9a, and their magnetic poles opposing the target 9 being opposite to that of the center permanent magnet 2.

The first intermediate permanent magnets 4 are arranged in the straight portion 1a, with their magnetization directions perpendicular to the target surface 9a, and their magnetic poles opposing the target 9 being opposite to that of the center permanent magnet 2. The second intermediate permanent magnets 5 are arranged on the base 8 via magnetic gaps, with their magnetization directions in parallel with the target surface 9a, one magnetic pole of each second intermediate permanent magnet 5 being opposing a near-target side surface portion 4a of the first intermediate permanent magnets 4, and the magnetic pole opposing the side surface 4a being opposite to that of the magnetic pole of the center permanent magnet 2 opposing the target 9. The third intermediate permanent magnets 6 are arranged, with their magnetization directions perpendicular to the target surface 9a, and their magnetic poles opposing the target 9 being the same as that of the center permanent magnet 2.

There are preferably magnetic gaps 10a, 10b, 10c, 10d between the center permanent magnet 2 and each first intermediate permanent magnet 4, between each first intermediate permanent magnet 4 and each second intermediate permanent magnet 5, between each second intermediate permanent magnet 5 and each third intermediate permanent magnet 6, and between each third intermediate permanent magnet 6 and each peripheral permanent magnet 3, and there is preferably a magnetic gap 11 between each second intermediate permanent magnet 5 and the base 8. There are preferably magnetic gaps 12a, 12b between the center permanent magnet 2 and each fourth intermediate permanent magnet 7, and between each fourth intermediate permanent magnet 7 and each peripheral permanent magnet 3. These magnetic gaps 10a, 10b, 10c, 10d, 11, 12a, 12b may be space or non-magnetic spacers.

The center permanent magnet 2, the peripheral permanent magnets 3, the first intermediate permanent magnets 4 and the fourth intermediate permanent magnets 7 preferably have substantially the same length in a perpendicular direction to the target surface 9a. The length of each third intermediate permanent magnet 6 is preferably less than the length of the center permanent magnet 2 in a perpendicular direction to the target surface 9a.

The surfaces of the center permanent magnet 2, the peripheral permanent magnets 3, the first intermediate permanent magnets 4, the second intermediate permanent magnets 5 and the fourth intermediate permanent magnets 7 on the side of the target 9 are preferably on the same plane S. The surfaces of the third intermediate permanent magnets 6 on the side of the target 9 are preferably lower than the above plane S.

Figure 2:
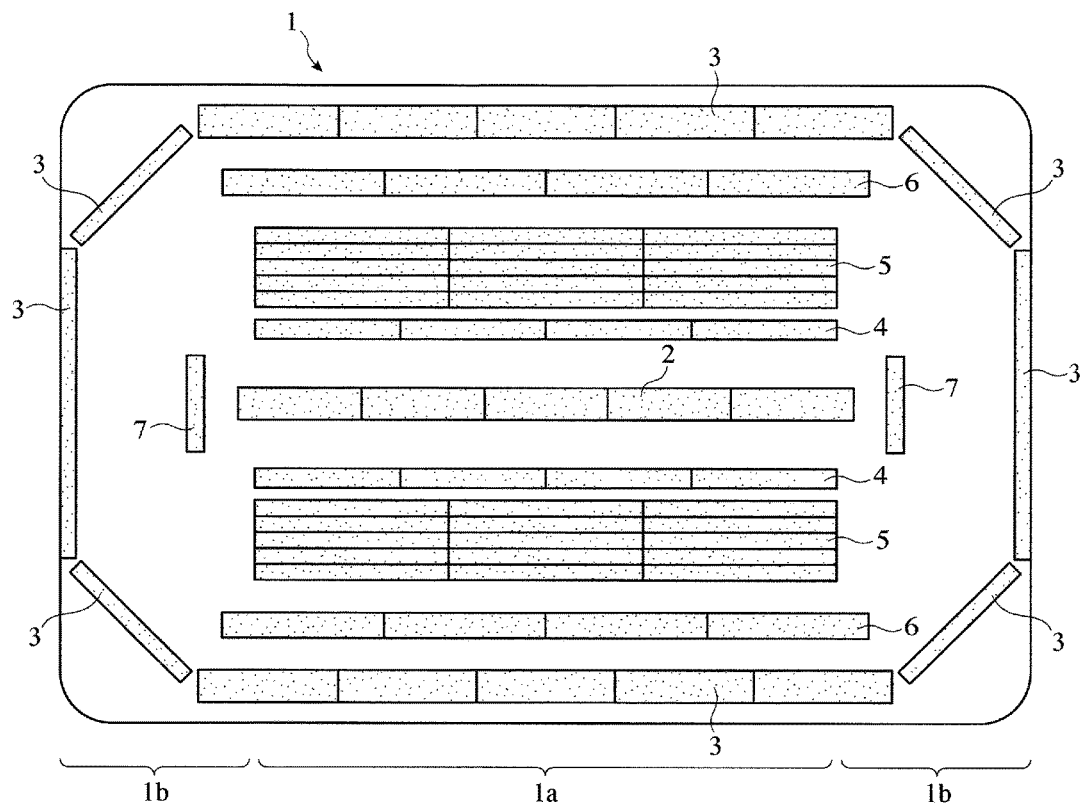
FIG. 2 is a plan view showing another example of magnetic-field-generating apparatuses for magnetron sputtering according to the present invention.

Each center permanent magnet 2, each first intermediate permanent magnet 4, each second intermediate permanent magnet 5, each third intermediate permanent magnet 6, and each fourth intermediate permanent magnet 7 may be integral, or constituted by pluralities of permanent magnets as shown in FIG. 2. Each peripheral permanent magnet 3 is preferably constituted by pluralities of permanent magnets as shown in FIG. 2. When each center permanent magnet 2, each peripheral permanent magnet 3, each first intermediate permanent magnet 4, each third intermediate permanent magnet 6 and each fourth intermediate permanent magnet 7 are constituted by pluralities of permanent magnets, individual permanent magnets may be bonded to the base 8 by an adhesive, etc., or integral permanent magnet units each constituted by bonded permanent magnets may be bonded to the base 8. Each second intermediate permanent magnet 5 is preferably constituted by permanent magnets bonded to the base 8 by an adhesive, etc. via a non-magnetic spacer, etc.

Figure 1C:
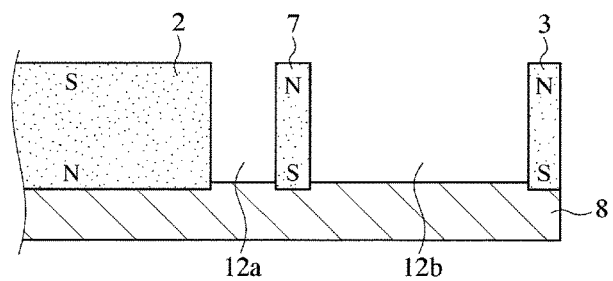
FIG. 1(c) is a cross-sectional view taken along the line B-B in FIG. 1(a).

Though the magnetic pole of the center permanent magnet 2 on the side of the target is an S pole in FIGS. 1(a), 1(b) and 1(c), this magnetic pole may be an N pole. In this case, the magnetic poles of all other permanent magnets should be made opposite.

(2) Center Permanent Magnet

The center permanent magnet 2 located in the straight portion 1a of the racetrack is preferably constituted by pluralities of rectangular parallelepiped permanent magnets connected straight on the magnetic base 8, with their magnetization directions perpendicular to the target surface 9a. The size and number of rectangular parallelepiped permanent magnets constituting the center permanent magnet 2 are not particularly restricted, but may be properly selected taking into consideration the easiness of producing magnets, the easiness of assembling the magnetic-field-generating apparatus, etc. The permanent magnets may not have the same shape.

The longitudinal length and width (length in a perpendicular direction to the longitudinal direction in the plan view) of the center permanent magnet 2, as well as its length in a perpendicular direction to the target surface 9a can be arbitrarily set, depending on the overall shape of the magnetic-field-generating apparatus 1, the intensity of a magnetic field generated, etc.

When a rectangular target is used in a general magnetron sputtering apparatus, the size of the magnetic-field-generating apparatus is substantially equal to or slightly smaller than that of the target, taking into consideration requirements such as its fixing method and cooling method. When the rectangular target and the magnetic-field-generating apparatus have the same size, the longitudinal length L2 of the center permanent magnet 2 is preferably equal to or more than the difference of the longitudinal length W1 and transverse length W2 of the target (or magnetic-field-generating apparatus).

(3) Peripheral Permanent Magnets

The peripheral permanent magnets 3 are arranged such that they surround the center permanent magnet 2, the first intermediate permanent magnets 4, the second intermediate permanent magnets 5, the third intermediate permanent magnets 6 and the fourth intermediate permanent magnets 7, and that the magnetic poles of the peripheral permanent magnets 3 opposing the target 9 (N poles in the figure) are opposite to that of the center permanent magnet 2 on the side of the target 9 (S pole in the figure). Thus, the peripheral permanent magnets 3 constitute a racetrack-shaped periphery. The peripheral permanent magnets 3 are preferably constituted by pluralities of rectangular parallelepiped permanent magnets. The size and number of rectangular parallelepiped permanent magnets are not particularly restricted, but may be properly selected taking into consideration the easiness of producing magnets, the easiness of assembling the magnetic-field-generating apparatus, etc. The permanent magnets may not have the same shape.

The width of the peripheral permanent magnets 3 and their length in a perpendicular direction to the target surface 9a can be arbitrarily set depending on the overall shape of the magnetic-field-generating apparatus 1, the intensity of a magnetic field generated, etc., though their length in a perpendicular direction to the target surface 9a is preferably the same as that of the center permanent magnet 2 in a perpendicular direction to the target surface 9a.

(4) First Intermediate Permanent Magnets

The first intermediate permanent magnets 4 are arranged on both sides of the center permanent magnet 2 in parallel therewith, with a predetermined distance from the center permanent magnet 2. The first intermediate permanent magnets 4 are arranged with their magnetization directions perpendicular to the target surface 9a, their magnetic poles opposing the target 9 (N pole in the figure) being opposite to that of the center permanent magnet 2 on the side of the target 9 (S pole in the figure). There are magnetic gaps 10a between the center permanent magnet 2 and the first intermediate permanent magnets 4.

The first intermediate permanent magnets 4 located in the straight portion 1a of the racetrack are preferably constituted by pluralities of connected rectangular parallelepiped permanent magnets, like the center permanent magnet 2. The size and number, etc. of permanent magnets having various shapes constituting the first intermediate permanent magnets 4 are not particularly restricted, but may be properly selected taking into consideration the easiness of producing magnets, the easiness of assembling the magnetic-field-generating apparatus, etc.

When the rectangular target is as large as the magnetic-field-generating apparatus, the first intermediate permanent magnets 4 preferably have longitudinal length equal to or more than the difference of the longitudinal length W1 and transverse length W2 of the target (magnetic-field-generating apparatus), like the center permanent magnet 2. The width (length in a perpendicular direction to the longitudinal direction in the plan view) of the first intermediate permanent magnets 4, and their length in a perpendicular direction to the target surface 9a are not particularly restricted, but may be arbitrarily set depending on the overall shape of the magnetic-field-generating apparatus, the intensity of a magnetic field generated, etc. However, the first intermediate permanent magnets 4 are preferably as long as the center permanent magnet 2 in a perpendicular direction to the target surface 9a.

(5) Second Intermediate Permanent Magnets

The second intermediate permanent magnets 5b are arranged between the first intermediate permanent magnets 4b and the third intermediate permanent magnets 6 in parallel with the center permanent magnet 2. The second intermediate permanent magnets 5 are arranged such that their magnetization directions are in parallel with the target surface 9a, one magnetic pole being opposing a near-target side surface portion 4a of each first intermediate permanent magnet 4, and the other magnetic pole being opposing each third intermediate permanent magnet 6. The magnetic pole (N pole in the figure) of each second intermediate permanent magnet 5 opposing a near-target side surface portion 4a of each first intermediate permanent magnet 4 is opposite to the target-side magnetic pole (S pole in the figure) of the center permanent magnet 2. The second intermediate permanent magnets 5 arranged in the straight portion 1a of the racetrack are preferably constituted by pluralities of rectangular parallelepiped permanent magnets connected in a longitudinal and/or width direction. The size, number, etc. of permanent magnets having various shapes constituting the second intermediate permanent magnets 5 are not particularly restricted, but may be properly selected taking into consideration the easiness of producing magnets, the easiness of assembling the magnetic-field-generating apparatus, etc.

There is a magnetic gap 10b between each first intermediate permanent magnet 4 and each second intermediate permanent magnet 5, and a magnetic gap 11 between each second intermediate permanent magnet 5 and the base 8. Each magnetic gap 10b, 11 may be a space acting as a magnetic gap, or filled with a non-magnetic spacer. Particularly, the magnetic gap 11 between each second intermediate permanent magnet 5 and the base 8 is preferably filled with a non-magnetic spacer.

The second intermediate permanent magnets 5 are preferably as long as the first intermediate permanent magnets 4 in a longitudinal direction. The length of the second intermediate permanent magnets 5 in a perpendicular direction to the target surface 9a is not particularly restricted, but may be arbitrarily set depending on the overall shape of the magnetic-field-generating apparatus, the intensity of a magnetic field generated, etc. However, the width (length in a perpendicular direction to the longitudinal direction in the plan view) of the second intermediate permanent magnets 5 is preferably 5-200%, more preferably 50-150%, of the length of the center permanent magnet 2 in a perpendicular direction to the target surface 9a.

(6) Third Intermediate Permanent Magnets

Each third intermediate permanent magnet 6 is arranged between each second intermediate permanent magnet 5 and each peripheral permanent magnet 3 with a predetermined distance from the second intermediate permanent magnet 5, in parallel with the center permanent magnet 2, such that its magnetic pole (S pole in the figure) opposing the target 9 is the same as the magnetic pole (S pole in the figure) of the center permanent magnet 2 on the side of the target 9. Each third intermediate permanent magnet 6 is preferably arranged in the straight portion 1a of the racetrack and constituted by pluralities of connected rectangular parallelepiped permanent magnets, like the center permanent magnet 2. The size, number, etc. of permanent magnets having various shapes constituting the third intermediate permanent magnets 6 are not particularly restricted, but may be properly selected taking into consideration the easiness of producing magnets, the easiness of assembling the magnetic-field-generating apparatus, etc.

There is a magnetic gap 10d between each third intermediate permanent magnet 6 and each peripheral permanent magnet 3. This magnetic gap 10 may be a space acting as a magnetic gap, or filled with a non-magnetic spacer.

The third intermediate permanent magnets 6 are preferably as long as or may be longer than the first intermediate permanent magnets 4, in a longitudinal direction. The width (length in a perpendicular direction to the longitudinal direction in the plan view) of the third intermediate permanent magnets 6 is not particularly restricted, but may be arbitrarily set depending on the overall shape of the magnetic-field-generating apparatus, the intensity of a magnetic field generated, etc. A surface of each third intermediate permanent magnet 6 on the side of the target 9 is preferably closer to the base 8 than a surface of the center permanent magnet 2 on the side of the target 9. In a perpendicular direction to the target surface 9a, the length of each third intermediate permanent magnet 6 is preferably 5-70% of that of the center permanent magnet 2.

(7) Fourth Intermediate Permanent Magnets

The fourth intermediate permanent magnets 7 are arranged in the corner portions 1b, with their longitudinal directions perpendicular to the longitudinal direction of the center permanent magnet 2, such that they are longitudinally separated from both ends of the center permanent magnet 2. The fourth intermediate permanent magnets 7 are arranged with their magnetization directions perpendicular to the target surface 9a, such that their magnetic poles opposing the target 9 (N poles in the figure) are opposite to the magnetic pole (S pole in the figure) of the center permanent magnet 2 on the side of the target 9. There are magnetic gaps 12a, 12b between the center permanent magnet 2 and each fourth intermediate permanent magnet 7, and between each fourth intermediate permanent magnet 7 and each peripheral permanent magnet 3.

The longitudinal length of each fourth intermediate permanent magnet 7 is preferably less than the distance between two first intermediate permanent magnets 4, 4 arranged in parallel on both sides of the center permanent magnet 2, so that the first intermediate permanent magnets 4, 4 and the fourth intermediate permanent magnets 7, 7 constitute a racetrack-shaped inner wall. The width of each fourth intermediate permanent magnet 7 and its length in a perpendicular direction to the target surface 9a when viewed in a plan view are not particularly restricted, but may be arbitrarily set depending on the overall shape of the magnetic-field-generating apparatus, the intensity of a magnetic field generated, etc., though its length in a perpendicular direction to the target surface 9a is preferably the same as the length of the center permanent magnet 2 in a perpendicular direction to the target surface 9a.

(8) Permanent Magnets

Permanent magnets constituting the magnetic-field-generating apparatus for magnetron sputtering may be made of known permanent magnet materials. Though permanent magnet materials used may be properly selected depending on the structure of the apparatus (distance from the magnetic-field-generating apparatus to the target) and the necessary intensity of a magnetic field, sintered rare earth magnets such as anisotropic sintered rare earth-iron-boron magnets (neodymium magnets) comprising R (at least one of rare earth elements such as Nd, etc.), T (Fe or Fe and Co) and B as indispensable components (having various surface treatments for improved corrosion resistance), etc. or ferrite magnets are preferable. The sintered rare earth magnets are particularly preferably neodymium magnets.

The center permanent magnet 2, the peripheral permanent magnets 3 and the first intermediate permanent magnets 4 are preferably constituted by sintered rare earth magnets (particularly neodymium magnets), and the residual magnetic flux density of the center permanent magnet 2 is preferably smaller than those of the first intermediate permanent magnets 4. The second intermediate permanent magnets 5, the third intermediate permanent magnets 6 and the fourth intermediate permanent magnets 7 are preferably constituted by ferrite magnets. The second intermediate permanent magnets 5, the third intermediate permanent magnets 6 and the fourth intermediate permanent magnets 7 may be constituted by sintered rare earth magnets, as long as proper adjustment is made by the magnet size, the distance from the target, the insertion of non-magnetic spacers between them and the base, etc.

In order to have different magnetic flux density distributions between the straight portion and the corner portions, different permanent magnet materials may be used in the straight portion and the corner portions depending on necessary magnetic flux densities.

In the magnetic-field-generating apparatus 1 for magnetron sputtering, permanent magnets and magnetic members are preferably constituted, such that a parallel component of the magnetic flux density is 10 mT or more in portions where a vertical component of the magnetic flux density is zero on the target surface 9a.

Figure 3:
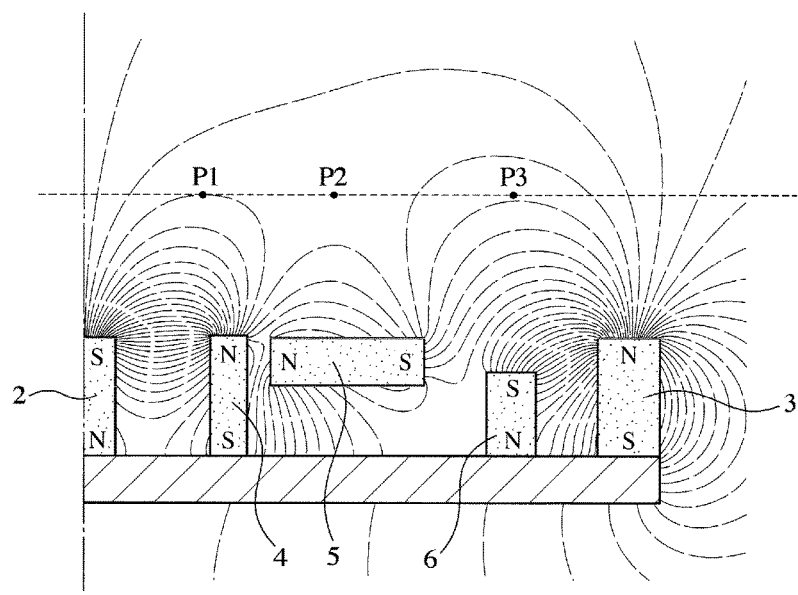
FIG. 3 is a schematic view showing a magnetic field with magnetic flux lines, when magnetic field analysis is conducted only in a straight portion of the magnetic-field-generating apparatus of the present invention for magnetron sputtering.

On the target surface 9a, there are preferably three points having no vertical component of a magnetic flux density, in a transverse direction from a position opposing a longitudinal center of the center permanent magnet 2 to the edge of the magnetic-field-generating apparatus. For example, FIG. 3 schematically shows a magnetic field by magnetic flux lines, when magnetic field analysis is conducted only in the straight portion of the magnetic-field-generating apparatus 1 of the present invention for magnetron sputtering. On the target surface (shown by the dotted line in the figure), a vertical component of a magnetic flux density is zero at a point P1 opposing the first intermediate permanent magnet 4, a point P2 opposing the second intermediate permanent magnet 5, and a point P3 opposing the third intermediate permanent magnet 6.

The present invention will be explained in more detail by Examples without intention of restriction.

EXAMPLE 1

Figure 4A:
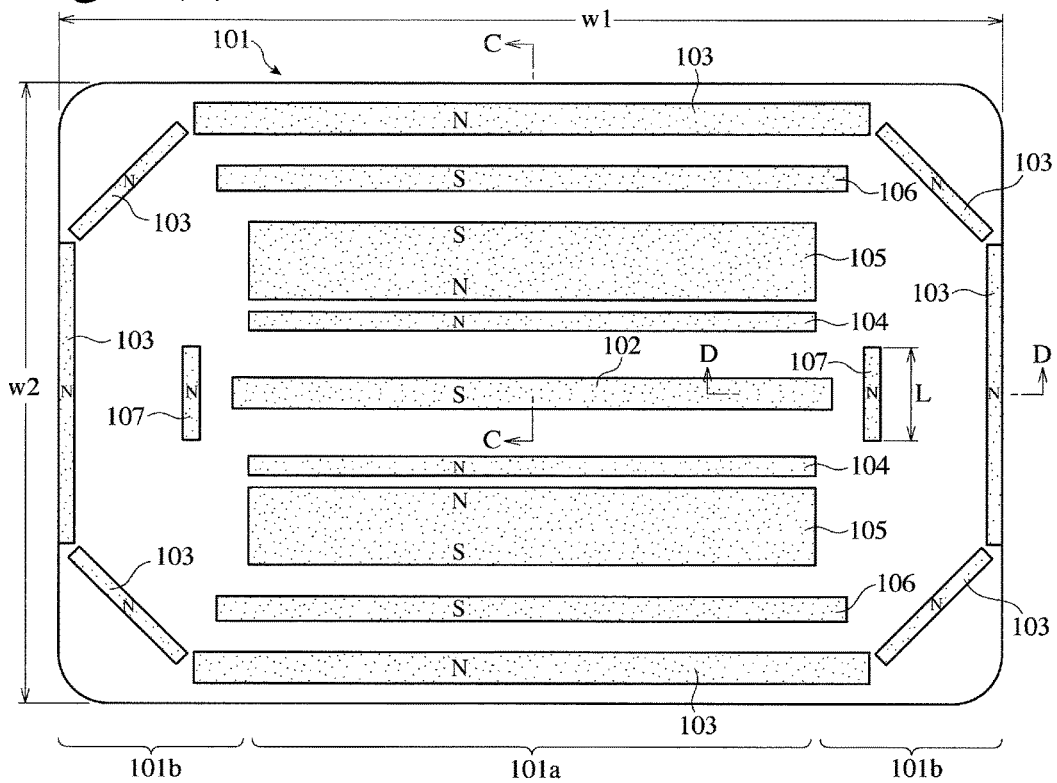
FIG. 4(a) is a plan view showing the magnetic-field-generating apparatus of Example 1 for magnetron sputtering.
Figure 4B:
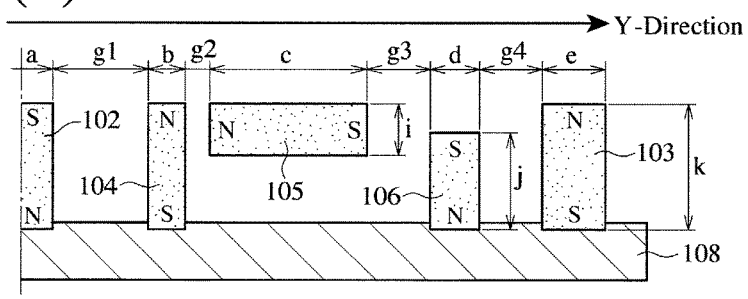
FIG. 4(b) is a cross-sectional view taken along the line C-C in FIG. 4(a).
Figure 4C:
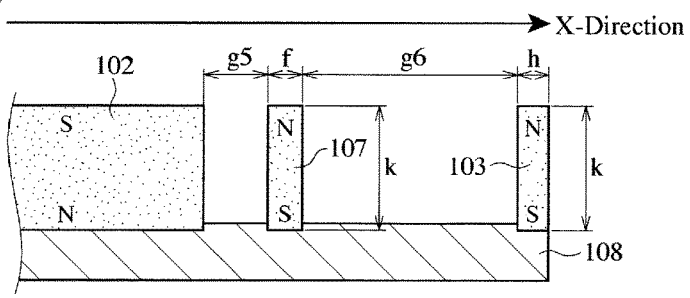
FIG. 4(c) is a cross-sectional view taken along the line D-D in FIG. 4(a).

As shown in FIGS. 4(a) to 4(c), a center permanent magnet 102, peripheral permanent magnets 103 and first intermediate permanent magnets 104 all constituted by sintered rare earth magnets (NMX-48BH available from Hitachi Metals Ltd. having a residual magnetic flux density of about 1,360 mT), and second intermediate permanent magnets 105, third intermediate permanent magnets 106 and fourth intermediate permanent magnets 107 all constituted by sintered ferrite magnets (NMF-12F available from Hitachi Metals Ltd. having a residual magnetic flux density of about 460 mT) were arranged on a base 108 of a steel plate (SS400), to produce a magnetic-field-generating apparatus 101 (w1=298 mm, w2=198 mm, a=5 mm, b=6 mm, c=25 mm, d=8 mm, e=10 mm, f=5 mm, h=5 mm, i=8 mm, j=14 mm, k=20 mm, L=30 mm, g1=15 mm, g2=4 mm, g3=10 mm, g4=10 mm, g5=10 mm, and g6=34 mm). The cross section of a straight portion 101a is shown in FIG. 4(b), and the cross section of a corner portion 101b is shown in FIG. 4(c). Though not depicted, magnetic gaps 110b, 110c, 111 surrounded by the first intermediate permanent magnets 104, the second intermediate permanent magnets 105, the third intermediate permanent magnets 106 and the base 108 were filled with non-magnetic (aluminum) spacers.

COMPARATIVE EXAMPLE 1

Figure 5A:
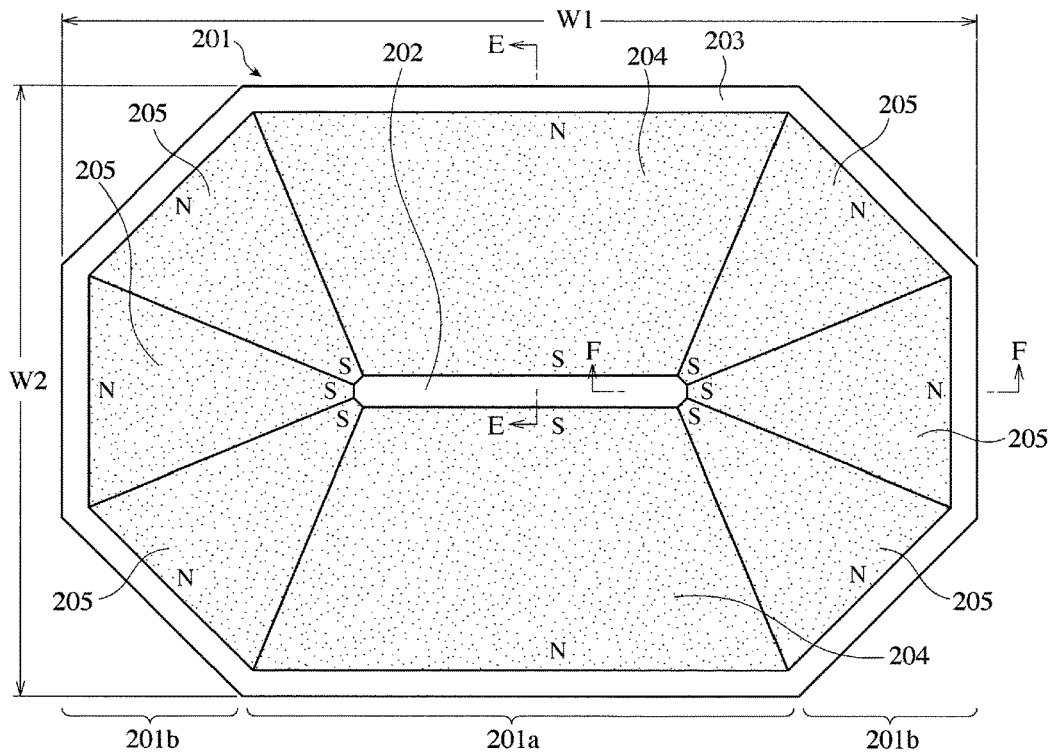
FIG. 5(a) is a plan view showing the magnetic-field-generating apparatus of Comparative Example 1 for magnetron sputtering.
Figure 5B:
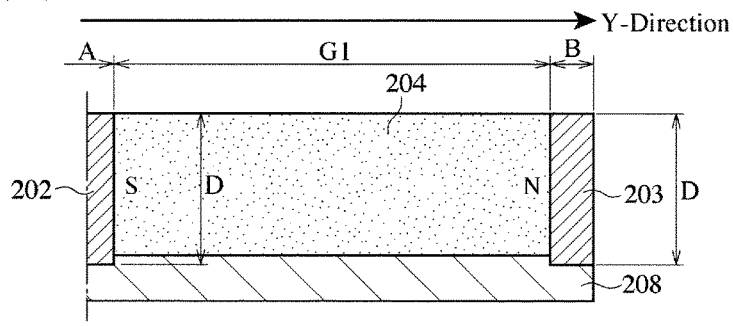
FIG. 5(b) is a cross-sectional view taken along the line E-E in FIG. 5(a).
Figure 5C:
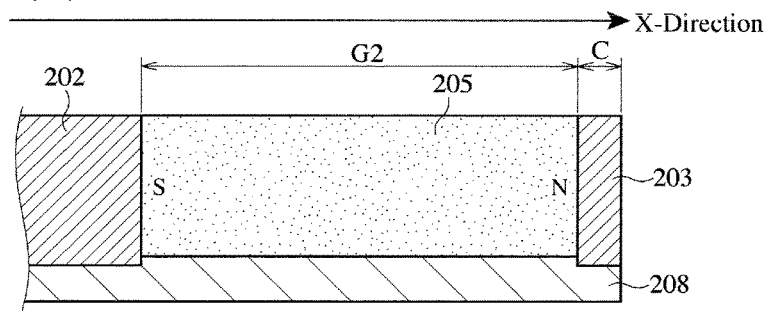
FIG. 5(c) is a cross-sectional view taken along the line F-F in FIG. 5(a).

As shown in FIGS. 5(a) to 5(c), a center magnetic pole member 202 and a peripheral magnetic pole member 203 both made of ferritic stainless steel (SUS430) were arranged on a base 208 of austenitic stainless steel (SUS304), and straight-portion permanent magnets 204 and corner-portion permanent magnets 205 both constituted by sintered ferrite magnets (NMX-5D available from Hitachi Metals Ltd. having a residual magnetic flux density of about 360 mT) were arranged on the base 208 with their magnetization directions in parallel with a target surface, and their magnetic poles of the same polarity opposing the center magnetic pole member 202, to produce a magnetic-field-generating apparatus 201 (W1=298 mm, W2=198 mm, A=10 mm, B=10 mm, C=10 mm, D=35 mm, G1=84 mm, and G2=84 mm).

Figure 6A:
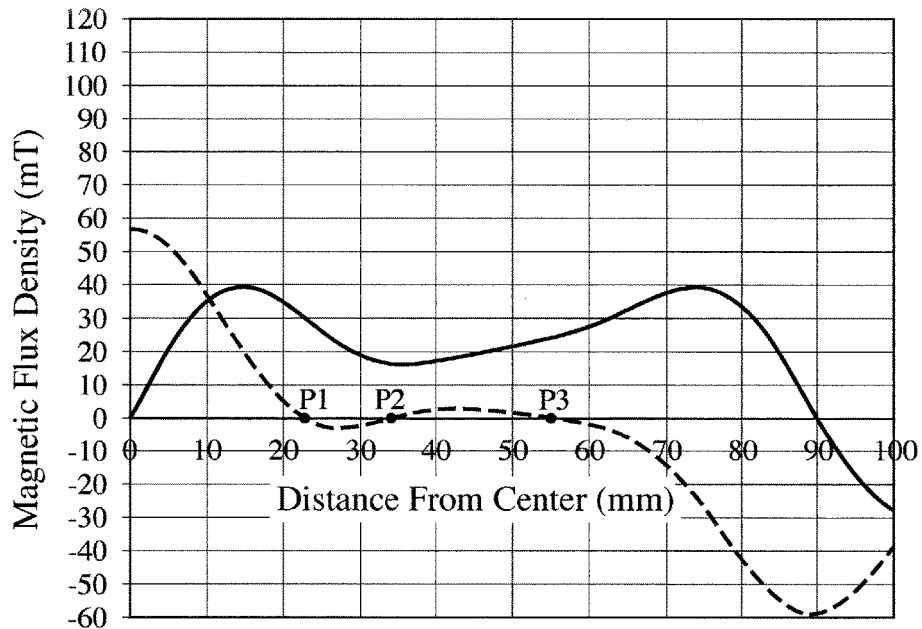
FIG. 6(a) is a graph in which parallel and vertical components of a magnetic flux density generated on the target surface by the magnetic-field-generating apparatus of Example 1 are plotted in a straight portion in a Y-direction.
Figure 6B:
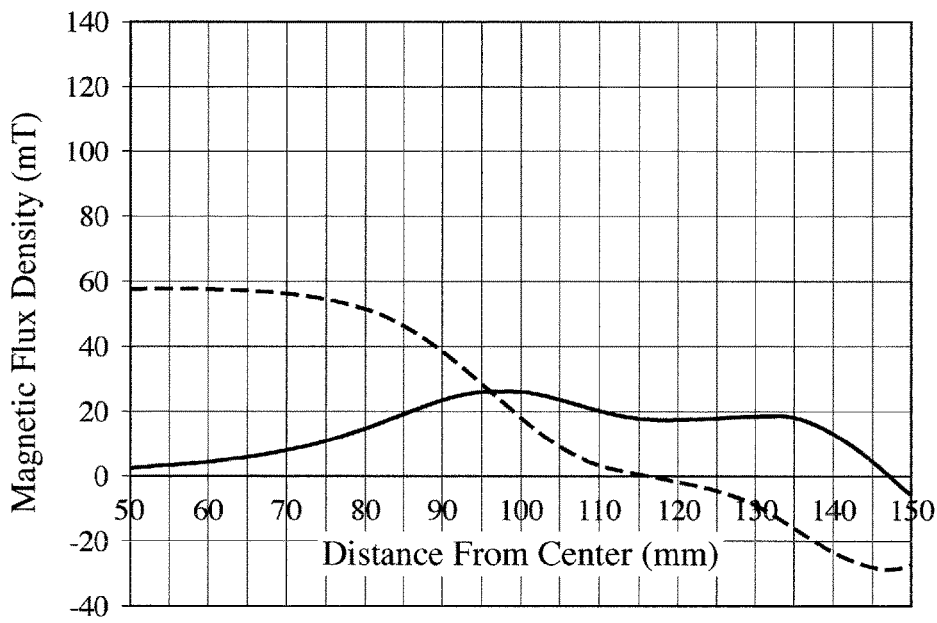
FIG. 6(b) is a graph in which parallel and vertical components of a magnetic flux density generated in a corner portion of the target surface by the magnetic-field-generating apparatus of Example 1 are plotted in an X-direction.

A magnetic flux density at positions [corresponding to the target surface (not shown)] as high as 20 mm from a target-opposing surface of the magnetic-field-generating apparatus of Example 1 was determined by a magnetic field analysis. Parallel and vertical components of the magnetic flux density to the target surface in the straight portion 101a and the corner portions 101b were plotted in a range from a center of the center permanent magnet 102 to the peripheral permanent magnet 103 (Y-direction and X-direction in FIG. 4), to obtain magnetic flux density distributions. The magnetic flux density distribution in the straight portion 101a (Y-direction) is shown in FIG. 6(a), and the magnetic flux density distribution in the corner portion 101b (X-direction) is shown in FIG. 6(b). The abscissa indicates the distance from the center of the center permanent magnet 102. The vertical component of the magnetic flux density is shown by a dotted line, and the parallel component of the magnetic flux density is shown by a solid line.

Figure 7A:
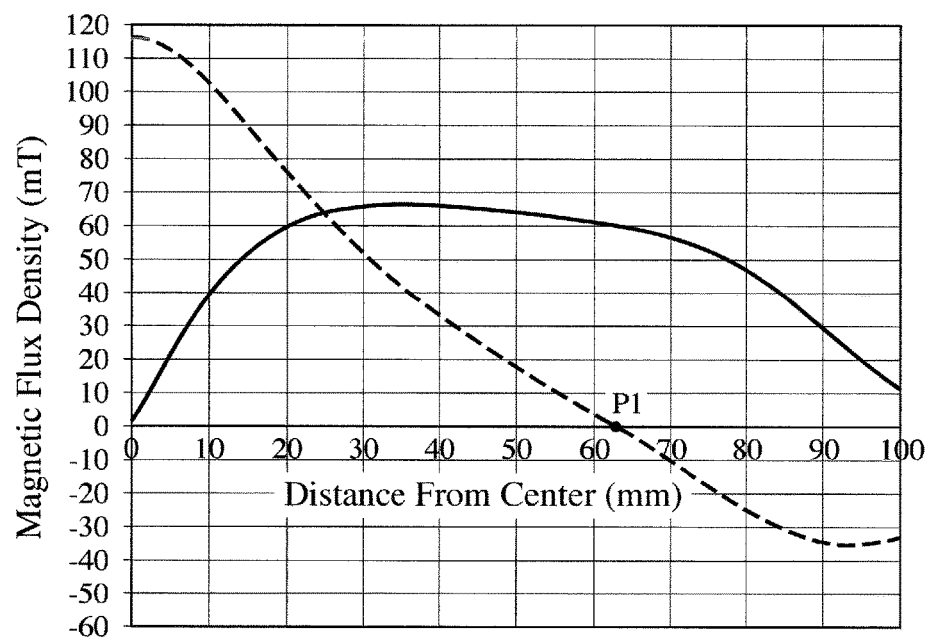
FIG. 7(a) is a graph in which parallel and vertical components of a magnetic flux density generated on the target surface by the magnetic-field-generating apparatus of Comparative Example 1 are plotted in a straight portion in a Y-direction.
Figure 7B:
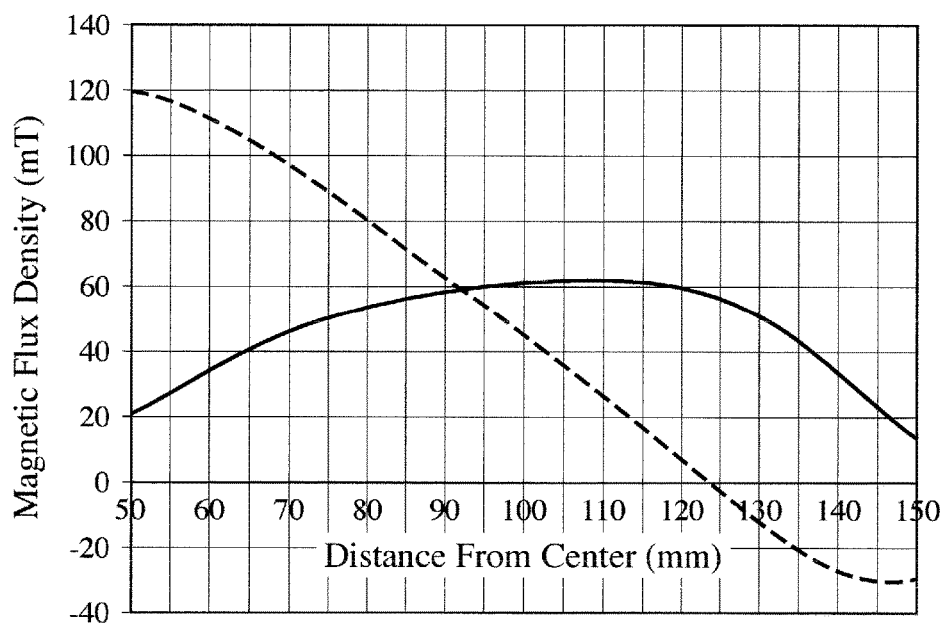
FIG. 7(b) is a graph in which parallel and vertical components of a magnetic flux density generated on the target surface by the magnetic-field-generating apparatus of Comparative Example 1 are plotted in a corner portion in an X-direction.

Likewise, a magnetic flux density at positions [corresponding to the target surface (not shown)] as high as 20 mm from a target-opposing surface of the magnetic-field-generating apparatus of Comparative Example 1 was determined by magnetic field analysis. Parallel and vertical components of the magnetic flux density to the target surface in the straight portion 201a and the corner portion 201b were plotted in a range from a center of the center magnetic pole member 202 to the peripheral magnetic pole member 203 [Y-direction and X-direction in FIG. 5(a)], to obtain magnetic flux density distributions. The magnetic flux density distribution in the straight portion 201a (Y-direction) is shown in FIG. 7(a), and the magnetic flux density distribution in the corner portion 201b (X-direction) is shown in FIG. 7(b). The abscissa indicates the distance from a center of the center magnetic pole member 202.

Figure 8A:
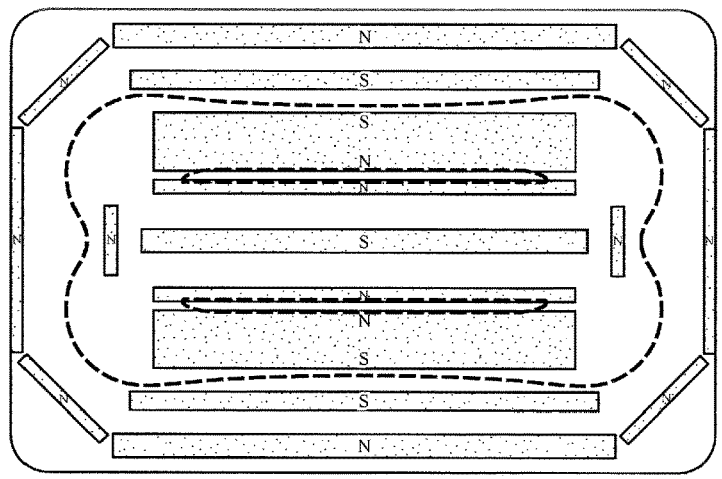
FIG. 8(a) is a schematic view showing the magnetic-field-generating apparatus of Present Invention 1, in which points at which a vertical component of a magnetic flux density is zero are connected by dotted lines.
Figure 8B:
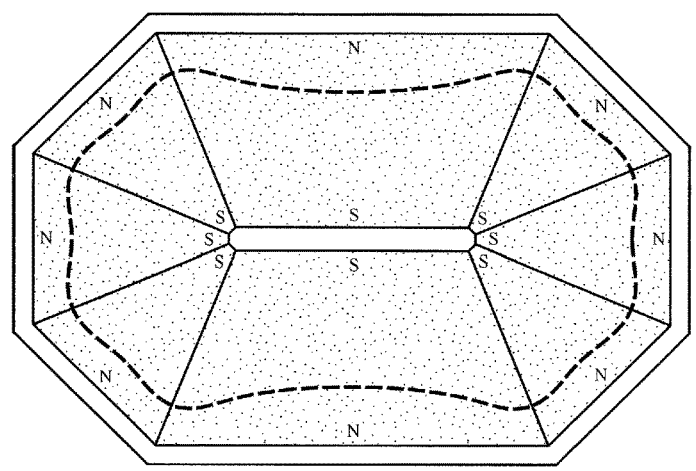
FIG. 8(b) is a schematic view showing the magnetic-field-generating apparatus of Comparative Example 1, in which points at which a vertical component of a magnetic flux density is zero are connected by a dotted line.
Figure 9:
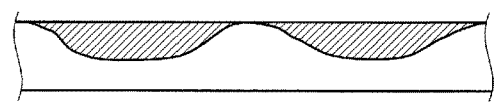
FIG. 9 is a schematic view showing the cross section of erosion in a target, when magnetron sputtering is conducted by using the magnetic-field-generating apparatus of the present invention for magnetron sputtering.
Figure 10A:
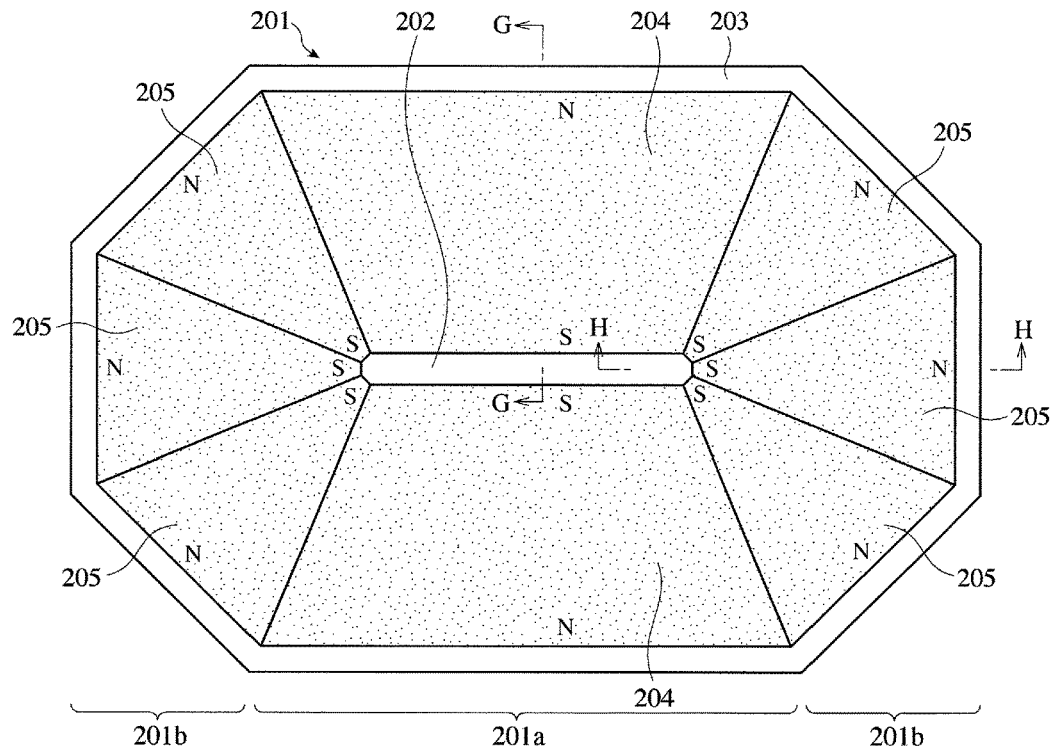
FIG. 10(a) is a plan view showing an example of conventional magnetic-field-generating apparatuses for magnetron sputtering.
Figure 10B:
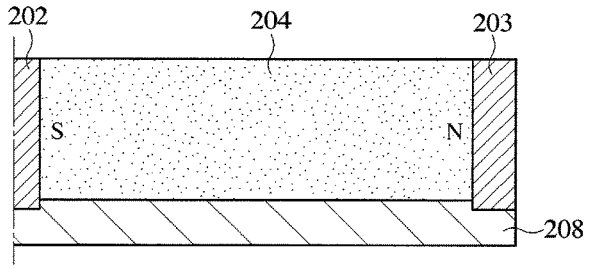
FIG. 10(b) is a cross-sectional view taken along the line G-G in FIG. 10(a).
Figure 10C:
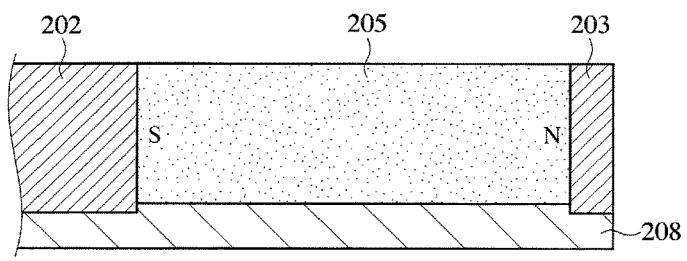
FIG. 10(c) is a cross-sectional view taken along the line H-H in FIG. 10(a).
Figure 11:
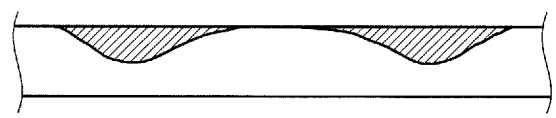
FIG. 11 is a schematic view showing the cross section of erosion in a target, when magnetron sputtering is conducted by using the conventional magnetic-field-generating apparatus for magnetron sputtering shown in FIG. 10(a).

It is clear from FIGS. 6(a), 6(b), 7(a) and 7(b) that the magnetic-field-generating apparatus 201 of Comparative Example 1 had only one point P1 in the magnetic flux density distribution in the straight portion 201a (Y-direction), at which a vertical component of a magnetic flux density was zero, while the magnetic-field-generating apparatus 101 of the present invention (Example 1) had three points P1, P2 and P3 in the magnetic flux density distribution in the straight portion 101a (Y-direction), at which a vertical component of a magnetic flux density was zero. FIGS. 8(a) and 8(b) show dotted lines connecting points at which a vertical component of a magnetic flux density is zero, in the magnetic-field-generating apparatuses of Example 1 and Comparative Example 1. Because of three points at which a vertical component of a magnetic flux density is zero, it is expected that the magnetic-field-generating apparatus 101 of the present invention (Example 1) has a wider U-shaped erosion region as shown in FIG. 9 than a V-shaped erosion region as shown in FIG. 11 in the magnetic-field-generating apparatus 201 of Comparative Example 1, resulting in more uniform erosion of the target, and thus improved use efficiency of the target.

What is claimed is:

1. A racetrack-shaped magnetic-field-generating apparatus for magnetron sputtering comprising a straight portion and corner portions, and opposing a target to generate a magnetic field on a target surface, comprising on a magnetic base (a) a center permanent magnet arranged straight in said straight portion with its magnetization direction perpendicular to said target surface;

(b) peripheral permanent magnets surrounding said center permanent magnet to form a racetrack-shaped periphery, with their magnetization directions perpendicular to said target surface, and their magnetic poles opposing said target being opposite to that of said center permanent magnet;

(c) first, second and third intermediate permanent magnets arranged straight in said straight portion on both sides of said center permanent magnet, in parallel with said center permanent magnet, in this order toward said peripheral permanent magnets; and (d) fourth intermediate permanent magnets arranged in said corner portions and longitudinally separate from both ends of said center permanent magnet, with their magnetization directions perpendicular to said target surface, and their magnetic poles opposing said target being opposite to that of said center permanent magnet;

said first intermediate permanent magnets being arranged with their magnetization directions perpendicular to said target surface, their magnetic poles opposing said target being opposite to that of said center permanent magnet;

said second intermediate permanent magnets being arranged on said base via a magnetic gap, with their magnetization directions in parallel with said target surface, such that one magnetic pole of each second intermediate permanent magnet opposes a near-target side surface portion of each first intermediate permanent magnet, and that a magnetic pole of each second intermediate permanent magnet opposing said near-target side surface is opposite to the magnetic pole of said center permanent magnet opposing said target; and said third intermediate permanent magnets being arranged with their magnetization directions perpendicular to said target surface, their magnetic poles opposing said target being the same as that of said center permanent magnet.

2. The magnetic-field-generating apparatus for magnetron sputtering according to claim 1, wherein said target surface has three points having no vertical component of a magnetic flux density, in a transverse direction from a position opposing a longitudinal center of said center permanent magnet.

3. The magnetic-field-generating apparatus for magnetron sputtering according to claim 1, wherein said center permanent magnet, said first intermediate permanent magnets and said peripheral permanent magnets are constituted by neodymium magnets;

said second, third and fourth intermediate permanent magnets are constituted by ferrite magnets; and said center permanent magnet has a smaller residual magnetic flux density than those of said first intermediate permanent magnets.

4. The magnetic-field-generating apparatus for magnetron sputtering according to claim 1, wherein a magnetic flux density in parallel direction to said target surface is 10 mT or more in portions where said magnetic flux density is zero in a perpendicular direction to said target surface.

* * * * *